US012617988B2

(12) United States Patent
Sawada et al.

(10) Patent No.: US 12,617,988 B2
(45) Date of Patent: May 5, 2026

(54) TEMPORARY ADHESIVE CONTAINING EPOXY-MODIFIED POLYSILOXANE

(71) Applicant: NISSAN CHEMICAL CORPORATION, Tokyo (JP)

(72) Inventors: Kazuhiro Sawada, Toyama (JP); Tetsuya Shinjo, Toyama (JP); Hiroshi Ogino, Toyama (JP); Satoshi Kamibayashi, Toyama (JP); Shunsuke Moriya, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 106 days.

(21) Appl. No.: 18/780,681

(22) Filed: Jul. 23, 2024

(65) Prior Publication Data

US 2024/0376356 A1 Nov. 14, 2024

Related U.S. Application Data

(63) Continuation of application No. 16/615,981, filed as application No. PCT/JP2018/019849 on May 23, 2018, now Pat. No. 12,077,686.

(30) Foreign Application Priority Data

May 24, 2017 (JP) ................................ 2017-102434

(51) Int. Cl.
*C09J 183/06* (2006.01)
*H01L 21/683* (2006.01)

(52) U.S. Cl.
CPC ........ *C09J 183/06* (2013.01); *H01L 21/6836* (2013.01); *C09J 2203/326* (2013.01); *H01L 2221/68318* (2013.01)

(58) Field of Classification Search
CPC ............... C09J 183/06; C09J 2203/326; H01L 21/6836; H01L 2221/68386
See application file for complete search history.

(56) References Cited

U.S. PATENT DOCUMENTS

| | | | |
|---|---|---|---|
| 4,011,247 A | 3/1977 | Sato et al. | |
| 7,482,249 B2 | 1/2009 | Jakob et al. | |
| 7,541,264 B2 | 6/2009 | Gardner et al. | |
| 8,173,522 B2 | 5/2012 | Jakob et al. | |
| 8,641,859 B2 | 2/2014 | Richter | |
| 8,911,583 B2 | 12/2014 | Jakob | |
| 8,951,886 B2 | 2/2015 | Richter | |
| 2006/0166464 A1 | 7/2006 | Jakob et al. | |
| 2008/0090380 A1* | 4/2008 | Gardner | H01L 21/6836 438/455 |
| 2009/0176349 A1 | 7/2009 | Jakob et al. | |
| 2010/0043608 A1 | 2/2010 | Jakob | |
| 2010/0120975 A1 | 5/2010 | Kuroda et al. | |
| 2011/0224344 A1 | 9/2011 | Fujisawa et al. | |
| 2011/0272092 A1 | 11/2011 | Richter | |
| 2012/0028438 A1 | 2/2012 | Richter | |
| 2013/0023109 A1 | 1/2013 | Harkness | |
| 2014/0150972 A1 | 6/2014 | Koellnberger et al. | |
| 2017/0200628 A1 | 7/2017 | Kamibayashi et al. | |
| 2017/0204252 A1 | 7/2017 | Timura et al. | |

FOREIGN PATENT DOCUMENTS

| | | | | |
|---|---|---|---|---|
| EP | 3 037 495 A1 | 6/2016 | | |
| JP | S50-64393 A | 5/1975 | | |
| JP | 2006-508540 A | 3/2006 | | |
| JP | 2008-532313 A | 8/2008 | | |
| JP | 2009-528688 A | 8/2009 | | |
| JP | 2010-070599 A | 4/2010 | | |
| JP | 2011-208120 A | 10/2011 | | |
| JP | 2012-510715 A | 5/2012 | | |
| JP | 2012-513684 A | 6/2012 | | |
| JP | 2013-520009 A | 5/2013 | | |
| JP | 2013-179135 A | 9/2013 | | |
| JP | 2013-232459 A | 11/2013 | | |
| JP | 2014-525953 A | 10/2014 | | |
| JP | 2015-074741 A | 4/2015 | | |
| KR | 20160071710 A * | 6/2016 | | C09J 11/06 |
| WO | 2015/186324 A1 | 12/2015 | | |

(Continued)

OTHER PUBLICATIONS

Jul. 17, 2018 International Search Report issued in International Patent Application No. PCT/JP2018/019849.

(Continued)

*Primary Examiner* — Daniel McNally
(74) *Attorney, Agent, or Firm* — Oliff PLC

(57) ABSTRACT

A temporary adhesive having excellent spin coating properties of a circuit side of a wafer and a support, and excellent heat resistance when the circuit side of the wafer or the support is attached to an adhesion layer or a rear surface of the wafer is processed, and is capable of easily separating the circuit side of the wafer from the support after polishing the rear surface of the wafer, and simply removing a adhesive attached to the wafer or the support after the separation. The adhesive contains a component (A) to be cured by a hydrosilylation reaction, and a component (B) containing an epoxy-modified polyorganosiloxane at a ratio in % by mass of the component (A) to the component (B) of 99.995:0.005 to 30:70. The component (B) is an epoxy-modified polyorganosiloxane having an epoxy value of 0.1 to 5.

21 Claims, No Drawings

(56) References Cited

FOREIGN PATENT DOCUMENTS

| | | | | |
|---|---|---|---|---|
| WO | WO-2015190438 A1 * | 12/2015 | ......... | H01L 21/6835 |
| WO | 2017/221772 A1 | 12/2017 | | |

OTHER PUBLICATIONS

Jul. 17, 2018 Written Opinion of the International Searching Authority issued in International Patent Application No. PCT/JP2018/019849.

Jan. 12, 2021 Extended Search Report issued in European Patent Application No. 18805209.6.

May 11, 2022 Notice of Reasons for Refusal issued Japanese Patent Application No. 2019-520287.

* cited by examiner

TEMPORARY ADHESIVE CONTAINING EPOXY-MODIFIED POLYSILOXANE

This application is a continuation application of U.S. application Ser. No. 16/615,981 filed Nov. 22, 2019, which is the U.S. national phase of PCT Application No. PCT/JP2018/019849 filed May 23, 2018, the entire disclosures of which are incorporated herein by reference.

TECHNICAL FIELD

The present invention relates to a temporary adhesive for fixing a wafer on a support when a rear surface of the wafer is polished, and a layered body using the same.

BACKGROUND ART

For conventional semiconductor wafers that are two-dimensionally integrated in a plane direction, a semiconductor integration technology of further integrating (layering) planes of wafers in a three-dimensional direction for further integration has been required. The layering in the three-dimensional direction is a technology in which wafers are integrated into a multilayer so as to be connected with a through silicon via (TSV). When semiconductor wafers are integrated into a multilayer, each of the semiconductor wafers to be integrated is thinned by polishing a surface (i.e., a rear surface) opposite to a surface on which a circuit is formed, and the thinned semiconductor wafers are layered.

In order to polish a surface with a polisher, a semiconductor wafer (herein, simply referred to as wafer) before thinning is attached to a support. In this case, attachment means temporary adhesion since easy separation is needed after polishing. When a large force is applied for detachment, a thinned semiconductor wafer may be broken or deformed. For a countermeasure against this, the thinned semiconductor wafer is easily detached from the support in temporary adhesion. However, it is not preferable that the semiconductor wafer be detached or shifted from the support by polishing stress when a rear surface of the semiconductor wafer is polished. Therefore, a performance required for the temporary adhesion is resistance to stress in polishing and easy detachment after polishing.

For example, performances such as high stress in a plane direction during polishing (high adhesion force) and low stress in a longitudinal direction during detachment (low adhesion force) are required.

As a process of such adhesion, a method in which an adhesion layer and a separation layer are provided and the separation layer is formed by plasma polymerization of dimethylsiloxane and mechanically separated after polishing (see Patent Documents 1 and 2), a method in which a semiconductor wafer is attached to a supporting substrate through an adhesive composition, a rear surface of the semiconductor wafer is polished, and the adhesive is then removed by an etching solution (see Patent Document 3), and a wafer processed body including, as an adhesion layer for attachment of a semiconductor wafer to a support, a combination of a polymerized layer obtained by polymerizing an alkenyl group-containing organopolysiloxane and a hydrosilyl group-containing organopolysiloxane using a platinum catalyst and a polymerized layer including a thermosetting polysiloxane (see Patent Documents 4 to 7) are disclosed.

PRIOR ART DOCUMENTS

Patent Documents

Patent Document 1: Japanese Patent Application Publication (Translation of PCT Application) No. 2012-510715 (JP 2012-510715 A)

Patent Document 2: Japanese Patent Application Publication (Translation of PCT Application) No. 2012-513684 (JP 2012-513684 A)

Patent Document 3: Japanese Patent Application Publication (Translation of PCT Application) No. 2008-532313 (JP 2008-532313 A)

Patent Document 4: Japanese Patent Application Publication No. 2013-179135 (JP 2013-179135 A)

Patent Document 5: Japanese Patent Application Publication No. 2013-232459 (JP 2013-232459 A)

Patent Document 6: Japanese Patent Application Publication No. 2006-508540 (JP 2006-508540 A)

Patent Document 7: Japanese Patent Application Publication No. 2009-528688 (JP 2009-528688 A)

SUMMARY OF THE INVENTION

Problem to be Solved by the Invention

Provided are a temporary adhesive that has excellent spin coating properties of a circuit side of a wafer and a support (supporting substrate), and excellent heat resistance when the circuit side of the wafer or the support is attached to an adhesion layer (an adhesion layer is cured) or a rear surface of the wafer is processed, and is capable of easily separating the circuit side of the wafer from the support after polishing the rear surface of the wafer, and simply removing the adhesion layer attached to the wafer or the support after the separation, a layered body using the temporary adhesive, and a processing method using the layered body.

Means for Solving the Problems

A first aspect of the present invention is an adhesive used to separatably attach a support to a circuit side of a wafer and process a rear surface of the wafer, the adhesive containing a component (A) to be cured by a hydrosilylation reaction, and a component (B) containing an epoxy-modified polyorganosiloxane at a ratio in % by mass of the component (A) to the component (B) of 99.995:0.005 to 30:70.

A second aspect of the present invention is the adhesive according to claim 1, wherein the component (A) contains a polysiloxane (A1) selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, a siloxane unit (T unit) of $R^6SiO_{3/2}$, and a combination thereof ($R^1$ to $R^6$ are each independently a monovalent chemical group that is a $C_{1-10}$ alkyl group, a $C_{2-10}$ alkenyl group, or a hydrogen atom, provided that $R_1$ to $R_6$ are each bonded to a silicon atom through a Si—C bond or a Si—H bond), and a platinum group metal-based catalyst (A2), and the polysiloxane (A1) contains a polyorganosiloxane (a1) (the polyorganosiloxane (a1) is selected from the group consisting of a siloxane unit (Q' unit) of $SiO_2$, a siloxane unit (M' unit) of $R^{1'}R^{2'}R^{3'}SiO_{1/2}$, a siloxane unit (D' unit) of $R^{4'}R^{5'}SiO_{2/2}$, a siloxane unit (T' unit) of $R^{6'}SiO_{3/2}$, and a combination thereof, and $R^{1'}$ to $R^{6'}$ are each independently a monovalent chemical group that is a $C_{1-10}$ alkyl group or a $C_{2-10}$ alkenyl group), and a polyorganosiloxane (a2) (the polyorganosiloxane (a2) is selected from the group consisting of a siloxane unit (Q" unit) of $SiO_2$, a siloxane unit (M" unit) of $R^{1''}R^{2''}R^{3''}SiO_{1/2}$, a siloxane unit (D" unit) of $R^{4''}R^{5''}SiO_{2/2}$, a siloxane unit (T" unit) of $R^{6''}SiO_{3/2}$, and a combination thereof, and $R^{1''}$ to $R^{6''}$ are each independently a $C_{1-10}$ alkyl group or a hydrogen atom).

A third aspect of the present invention is the adhesive according to the first or second aspect, wherein the component (B) is an epoxy-modified polyorganosiloxane having an epoxy value of 0.1 to 5.

A fourth aspect of the present invention is the adhesive according to any one of the first to third aspects, wherein the processing is polishing the rear surface of the wafer.

A fifth aspect of the present invention is a method for forming a layered body including a first step of applying the adhesive according to any one of the first to fourth aspects to a surface of a first body to form an adhesion layer, a second step of attaching a surface of a second body to the adhesion layer, and heating the adhesion layer from a side of the first body to cure the adhesion layer.

A sixth aspect of the present invention is the method according to claim 5, wherein the first body is a support, the second body is a wafer, and in the second step, a circuit side of the wafer is a face facing the surface of the first body.

A seventh aspect of the present invention is the method according to claim 5, wherein the first body is a wafer, the second body is a support, and in the second step, a circuit side of the wafer is a face facing the surface of the second body.

An eighth aspect of the present invention is a separation method including a first step of applying the adhesive according to any one of claims 1 to 4 to a surface of a first body to form an adhesion layer, a second step of attaching a surface of a second body to the adhesion layer, a third step of heating the adhesion layer from a side of the first body to cure the adhesion layer, forming a layered body, a fourth step of processing the layered body, and a fifth step of separating the adhesion layer from the first or second body.

A ninth aspect of the present invention is the separation method according to claim 8, wherein the first body is a support, the second body is a wafer, and in the second step, a circuit side of the wafer is a face facing the surface of the first body.

A tenth aspect of the present invention is the separation method according to claim 8, wherein the first body is a wafer, the second body is a support, and in the second step, a circuit side of the wafer is a face facing the surface of the second body.

An eleventh aspect of the present invention is the separation method according to any one of claims 8 to 10, wherein the processing is polishing the rear surface of the wafer.

Effects of the Invention

The present invention provides an adhesive used to separatably attach a support to a circuit side of a wafer and process a rear surface of the wafer, the adhesive containing a component (A) to be cured by a hydrosilylation reaction, and a component (B) containing an epoxy-modified polyorganosiloxane.

Further, the present invention provides a layered body that contains, as a temporary adhesive to be placed between a support and a circuit side of a wafer, a component (A) to be crosslinked and cured by a hydrosilylation reaction and a component (B) having an epoxy group and is used to process a rear surface of the wafer opposite to the circuit side of the wafer.

The adhesive of the present invention includes a combination of specific polysiloxanes as components. Therefore, the adhesive has the following effects. The adhesive has excellent spin coating properties of the circuit side of the wafer, and excellent heat resistance when the circuit side of the wafer or the support is attached to an adhesion layer or the rear surface of the wafer is processed. Separation can be easily carried out after processing the rear surface of the wafer, that is, after polishing. After the separation, the adhesive attached to the wafer or the support can be simply removed by a solvent or a tape.

In processing of a side opposite to the circuit side of the wafer, for example, the wafer is thinned by polishing. After then, a through silicon via (TSV) or the like can be formed on the wafer. Subsequently, the thinned wafer is separated from the support and a layered body of the wafer is formed. Thus, three-dimensional mounting is carried out. Before or after this time, an electrode or the like on the rear surface of the wafer is also formed. In the thinning of the wafer and the TSV process, the wafer is heated at 250 to 350° C. with the wafer attached to the support. However, the layered body using the adhesive of the present invention has heat resistance thereto.

MODES FOR CARRYING OUT THE INVENTION

The present invention is an adhesive used to separatably attach a support to a circuit side of a wafer and process a rear surface of the wafer, the adhesive containing a component (A) to be cured by a hydrosilylation reaction, and a component (B) containing an epoxy-modified polyorganosiloxane at a ratio in % by mass of the component (A) to the component (B) of 99.995:0.005 to 30:70.

In the present invention, a support is temporarily attached to a wafer by the adhesive, and a rear surface opposite to a circuit side of the wafer is processed by polishing, for example. Thus, the thickness of the wafer can be decreased.

The temporary attachment means that when the rear surface of the wafer is polished, the support is attached to the wafer, and the support can be separated from a thinned wafer after polishing the rear surface of the wafer.

Herein, separatable means that the separation strength is lower than that at another part to be separated and separation is easy.

In the present invention, an adhesion layer (a temporary adhesion layer) is formed from the adhesive. The adhesive contains the components (A) and (B), and may further contain another additive.

The component (A) contains a polysiloxane (A1) selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, a siloxane unit (T unit) of $R^6SiO_{3/2}$, and a combination thereof ($R^1$ to $R^6$ are each independently a monovalent chemical group that is a $C_{1-10}$ alkyl group, a $C_{2-10}$ alkenyl group, or a hydrogen atom, provided that $R_1$ to $R_6$ are each bonded to a silicon atom through a Si—C bond or a Si—H bond), and a platinum group metal-based catalyst (A2). The polysiloxane (A1) contains a polyorganosiloxane (a1) (the polyorganosiloxane (a1) is selected from the group consisting of a siloxane unit (Q' unit) of $SiO_2$, a siloxane unit (M' unit) of $R^{1'}R^{2'}R^{3'}SiO_{1/2}$, a siloxane unit (D' unit) of $R^{4'}R^{5'}SiO_{2/2}$, a siloxane unit (T' unit) of $R^{6'}SiO_{3/2}$, and a combination thereof, and $R^{1'}$ to $R^{6'}$ are each independently a monovalent chemical group that is a $C_{1-10}$ alkyl group or a $C_{2-10}$ alkenyl group), and a polyorganosiloxane (a2) (the polyorganosiloxane (a2) is selected from the group consisting of a siloxane unit (Q" unit) of $SiO_2$, a siloxane unit (M" unit) of $R^{1''}R^{2''}R^{3''}SiO_{1/2}$, a siloxane unit (D" unit) of $R^{4''}R^{5''}SiO_{2/2}$, a siloxane unit (T" unit) of $R^{6''}SiO_{3/2}$, and a combination thereof, and $R^{1''}$ to $R^{6''}$ are each independently a $C_{1-10}$ alkyl group or a hydrogen atom).

The polysiloxane (A1) contains the polyorganosiloxanes (a1) and (a2). The $C_{2-10}$ alkenyl group contained in the polyorganosiloxane (a1) and the hydrogen atom (Si—H group) contained in the polyorganosiloxane (a2) are subjected to a hydrosilylation reaction using the platinum group metal-based catalyst (A2) to form a crosslinking structure, resulting in curing.

The polyorganosiloxane (a1) is selected from the group consisting of the Q' unit, the M' unit, the D' unit, the T' unit, and a combination thereof. For example, the polyorganosiloxane (a1) can be formed from a combination of (the Q' unit and the M' unit) and (the D' unit and the M' unit), a combination of (the T' unit and the M' unit) and (the D' unit and the M' unit), a combination of (the Q' unit, the T' unit, and the M' unit) and (the T' unit and the M' unit), a combination of (the T' unit and the M' unit), or a combination of (the Q' unit and the M' unit).

The polyorganosiloxane (a2) is selected from the group consisting of the Q" unit, the M" unit, the D" unit, the T" unit, and a combination thereof. For example, the polyorganosiloxane (a2) can be formed from a combination of (the M" unit and the D" unit), a combination of (the Q" unit and the M" unit), or a combination of (the Q" unit, the T" unit, and the M" unit).

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dipentenylmethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, and 1-i-propyl-2-propenyl group. In particular, ethenyl group, that is, vinyl group, or 2-propenyl group, that is, allyl group can be preferably used.

Examples of the $C_{1-10}$ alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group. In particular, methyl group can be preferably used.

The polyorganosiloxane (a1) includes a siloxane unit having the $C_{1-10}$ alkyl group and the $C_{2-10}$ alkenyl group as substituents, for examples, a siloxane unit in which the $C_{1-10}$ alkyl group is methyl group, and the $C_{2-10}$ alkenyl group is ethenyl group, that is, vinyl group. In all substituents of $R^{1'}$ to $R^{6'}$, the ratio of the alkenyl group may be 0.1% by mole to 50.0% by mole, and preferably 0.5% by mole to 30.0% by mole, and the rest of $R^1$ to $R^6$ may be alkyl group.

The polyorganosiloxane (a2) includes a siloxane unit having the $C_{1-10}$ alkyl group and a hydrogen atom as substituents, for example, a siloxane unit in which the $C_{1-10}$ alkyl group is methyl group, and the hydrogen atom forms a Si—H structure. The ratio of the hydrogen atom, that is, a Si—H group in all the substituents of $R^1$ to $R^6$ may be 0.1% by mole to 50.0% by mole, and preferably 10.0% by mole to 40.0% by mole, and the rest of $R^1$ to $R^6$ may be alkyl group.

The polysiloxane (A1) may contain the polyorganosiloxane (a1) and the polyorganosiloxane (a2), for example, at a molar ratio of the alkenyl group contained in the polyorganosiloxane (a1) to the hydrogen atom in the Si—H group contained in the polyorganosiloxane (a2) of 2.0:1.0, and preferably 1.5:1.0.

The weight average molecular weight of the polyorganosiloxane (a1) to be used may fall within a range of 500 to 1,000,000, and the weight average molecular weight of the polyorganosiloxane (a2) to be used may fall within a range of 5,000 to 50,000.

The component (A) contains the platinum group metal-based catalyst (A2). A platinum-based metal catalyst is a catalyst for promoting a hydrosilylation addition reaction of the alkenyl group with the Si—H group. The platinum-based metal catalyst such as platinum black, platinum chloride, chloroplatinic acid, a reactant of chloroplatinic acid with a monovalent alcohol, a complex of chloroplatinic acid with an olefin, and platinum bisacetoacetate is used. Examples of the complex of platinum with an olefin include a complex of divinyltetramethyldisiloxane with platinum. The amount of the platinum catalyst to be added may fall within a range of 1.0 to 50.0 ppm relative to the total amount of the polyorganosiloxanes (a1) and (a2).

The component (A) may further contain an alkynyl alcohol as an inhibitor (A3) for inhibiting the advance of the hydrosilylation reaction. Examples of the inhibitor include 1-ethynyl-1-cyclohexanol. The inhibitor may be added in an amount falling within a range of 1000.0 to 10000.0 ppm relative to the total amount of the polyorganosiloxanes (a1) and (a2).

The epoxy-modified polyorganosiloxane used in the component (B) of the present invention contains a siloxane unit (a D''' unit) of $R^{1'''}R^{2'''}SiO_{2/2}$ (wherein $R^{1'''}$ is a $C_{1-10}$ alkyl group, and $R^{2'''}$ is a $C_{1-10}$ alkyl group or epoxy group, provided that $R^{1'''}$ and $R^{2'''}$ are each bonded to a silicon atom through a Si—C bond). Examples of the $C_{1-10}$ alkyl group of $R^{1'''}$ includes examples described above.

The alkyl group is preferably methyl group, and the epoxy group is preferably 3-glycidoxypropyl or 2-(3,4-epoxycyclohexyl)ethyl). Examples of the epoxy-modified polyorganosiloxane include epoxy-modified polydimethylsiloxane.

The polyorganosiloxane used in the component (B) contains the siloxane unit (the D''' unit), and may further contain the aforementioned Q unit, M unit, and T unit. For example, the polyorganosiloxane may contain only the D''' unit, a combination of the D''' unit and the Q unit, a combination of the D''' unit and the M unit, a combination of the D''' unit and the T unit, a combination of the D''' unit, the Q unit, and the M unit, a combination of the D''' unit, the M unit, and the T unit, a combination of the D''' unit, the Q unit, the M unit, and the T unit, or the like.

The component (B) may be an epoxy-modified polydimethylsiloxane having an epoxy value of 0.1 to 5.

The weight average molecular weight of the component (B) falls within a range of 1,500 to 500,000, and preferably 1,500 to 100,000.

In the adhesive of the present invention, the ratio of the component (A) to the component (B) may be any ratio.

In terms of adhesion, the ratio of the component (A) to the component (B) in the adhesive may be any ratio. In order to further achieve favorable separation property, it is desirable that the component (B) be contained in an amount of 0.005% by mass or more relative to the total amount of the components (A) and (B). In order to maintain mechanical physical properties of the adhesive, it is desirable that the component (B) be contained in an amount of 70% by mass or less. In the adhesive, the ratio in % by mass of the component (A) to the component (B) is 99.995:0.005 to 30:70, and preferably 99.9:0.1 to 75:25.

In the present invention, provided is a method for forming a layered body including a first step of applying the aforementioned adhesive to a surface of a first body to form an adhesion layer, a second step of attaching a surface of a second body to the adhesion layer, and a third step of heating the adhesion layer from a side of the first body to cure the adhesion layer. By heating, the adhesive is cured.

Provided is the method for forming a layered body, wherein the first body is a support, the second body is a wafer, and in the second step, a circuit side of the wafer is a face facing the surface of the first body.

Provided is the method for forming a layered body, wherein the first body is a wafer, the second body is a support, and in the second step, a circuit side of the wafer is a face facing the surface of the second body.

Examples of the wafer include a silicon wafer having a diameter of 300 mm and a thickness of about 770 μm.

Examples of the support (carrier) include a glass wafer and a silicon wafer that have a diameter of 300 mm and a thickness of about 700 mm.

For example, the adhesion layer may be formed by applying the adhesive to a surface of the support with a spin coater, and the layered body may be formed by attaching the surface of the support to the circuit side of the wafer so as to dispose the adhesion layer between the support and the wafer and heating the adhesion layer at a temperature of 120 to 260° C., resulting in curing.

Alternatively, the adhesion layer may be formed by applying the adhesive to the circuit side of the wafer with a rear surface of the wafer disposed downwardly using a spin coater, and the layered body may be formed by attaching the support to the wafer so that the adhesive (the adhesion layer) is disposed between the support and the wafer and heating the adhesive (the adhesion layer) at a temperature of 120 to 260° C., resulting in curing. The curing of the adhesive (the adhesion layer) starts at a heating temperature of about 120° C. The heating temperature may be 260° C. or higher. From the viewpoint of heat resistance of the circuit side (device side) of the wafer, the heating temperature is preferably 260° C. or lower. For example, the heating temperature may be about 150° C. to 220° C. or about 190° C. to 200° C. From the viewpoint of conjugation of the wafer caused by curing, the heating time is desirably one minute or more. From the viewpoint of stability of physical properties of the adhesive, the heating time is further preferably five minutes or more. For example, the heating time may be 1 to 180 minutes or 5 to 120 minutes. As an apparatus, a hot plate, an oven, or the like may be used.

In order to adjust the viscosity of the adhesive, a solvent may be added. An aliphatic hydrocarbon, an aromatic hydrocarbon, a ketone, or the like may be used. As the solvent, for example, hexane, heptane, octane, nonane, decane, undecane, dodecane, isododecane, menthane, limonene, toluene, xylene, mesitylene, cumene, methyl isobutyl ketone (MIBK), butyl acetate, diisobutyl ketone, 2-octanone, 2-nonanone, 5-nonanone, or the like may be used.

When the support and the wafer are jointed under reduced pressure (e.g., a reduced pressure of 10 Pa to 10,000 Pa) so that the adhesion layer is disposed between the support and the wafer, the layered body can be formed. When the support and the wafer are jointed, heating (e.g., at 30° C. to 100° C.) may be carried out under reduced pressure.

Provided is a separation method including a first step of applying the aforementioned adhesive to a surface of a first body to form an adhesion layer, a second step of attaching a surface of a second body to the adhesion layer, a third step of heating the adhesion layer to cure the adhesion layer, forming a layered body, a fourth step of processing the layered body, and a fifth step of separating the adhesion layer from the first or second body (separating the adhesion layer on an interface between the first or second body and the adhesion layer).

Provided is the separation method, wherein the first body is a support, the second body is a wafer, and in the second step, a circuit side of the wafer is a face facing the surface of the first body.

Provided is the separation method, wherein the first body is a wafer, the second body is a support, and a circuit side of the wafer is a face facing the surface of the second body.

The thickness of the adhesion layer obtained by applying the adhesive may be 5 to 500 μm, 10 to 200 μm, 20 to 150 μm, 30 to 120 μm, or 30 to 70 μm.

Processing of a side opposite to the circuit side of the wafer is polishing of a rear surface of the wafer to thin the wafer. A through silicon via (TSV) or the like is then formed, the thinned wafer is separated from the support, and a layered body of the wafer is formed. Thus, three-dimensional mounting is carried out. Before or after this time, an electrode or the like on the rear surface of the wafer is also formed. In thinning of the wafer and a TSV process, the wafer attached to the support is heated at 250 to 350° C. However, the layered body as the temporary adhesive used in the present invention has heat resistance thereto.

For example, a wafer having a diameter of 300 mm and a thickness of about 770 μm can be thinned to a thickness to about 80 μm to 4 μm by polishing a rear surface opposite to a circuit side that is a surface.

The wafer is attached to a support, the rear surface of the wafer is processed (polished), and the wafer is separated from the support. Examples of the separation method include separation using a solvent, separation using a laser, mechanical separation using a machine having a sharp part, and separation by pulling the support and the wafer.

When a resin (adhesion layer) remains on the surface of the wafer, the resin can be removed by washing with a solvent (dissolution, lift-off), tape peeling, or the like.

The present invention is a method for processing the layered body including achieving attachment by the aforementioned method, polishing the rear surface of the wafer, and achieving separation by the aforementioned method.

EXAMPLES

Synthesis Example 1

Preparation of Component (A) in Adhesive 22.49 kg of base polymer including a vinyl group-containing linear polydimethylsiloxane having a viscosity of 200 mPa·s and a vinyl group-containing MQ resin (available from Wacker Chemie AG) as a polyorganosiloxane (a1) and 2.370 kg of SiH group-containing linear polydimethylsiloxane having a viscosity of 100 mPa·s (available from Wacker Chemie AG) as a polyorganosiloxane (a2), and 62.4 g of 1-ethynylcyclohexanol (available from Wacker Chemie AG) as an inhibitor (A3) were stirred for 40 minutes with a stirrer (planetary mixer manufactured by INOUE MFG., INC.). Separately, 29.9 g of platinum catalyst (available from Wacker Chemie AG) as a platinum group metal-based catalyst (A2) and 1.30 kg of vinyl group-containing linear polydimethylsiloxane having a viscosity of 200 mPa·s (available from Wacker Chemie AG) as a polyorganosiloxane (a2) were stirred for 30 minutes with Three-one motor (manufactured by Shinto Scientific Co., Ltd.) to obtain a mixture. 1.11 kg of the mixture was added to the aforementioned mixture, and the mixture was stirred for 40 minutes, and filtered through a 5-μm polypropylene (PP) filter to obtain a component (A) in an adhesive (Sample 1).

Synthesis Example 2

To 35 g of the component (A), 15 g of ECMS-227 (trade name, available from Gelest, Inc.) as a component (B) was added to prepare an adhesive (Sample 2).

The structure of ECMS-227 is represented by Formula (B-1).

Formula (B-1)

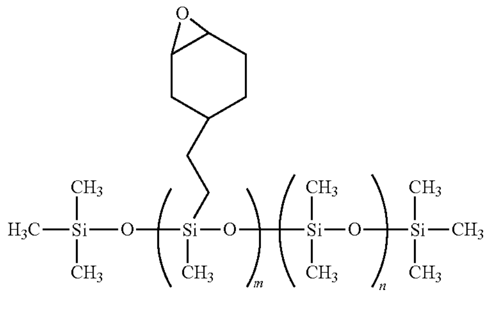

The weight average molecular weight thereof was 27,000. m and n are each the number of repeating units.

Synthesis Example 3

To 35 g of the component (A), 15 g of ECMS-327 (trade name, available from Gelest, Inc.) as a component (B) was added to prepare an adhesive (Sample 3).

The structure of ECMS-327 is represented by Formula (B-2).

Formula (B-2)

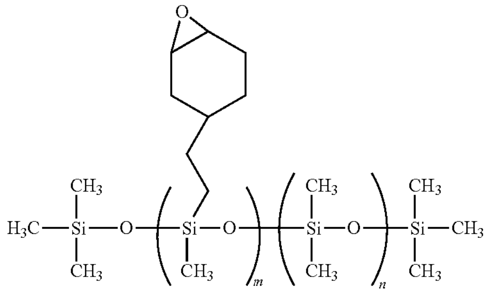

The weight average molecular weight thereof was 28,800. m and n are each the number of repeating units.

Synthesis Example 4

To 99.99 g of the component (A), 0.01 g of KF-101 (trade name, available from Shin-Etsu Chemical Co., Ltd.) as a component (B) was added to prepare an adhesive (Sample 4).

The structure of KF-101 is represented by Formula (B-3).

Formula (B-3)

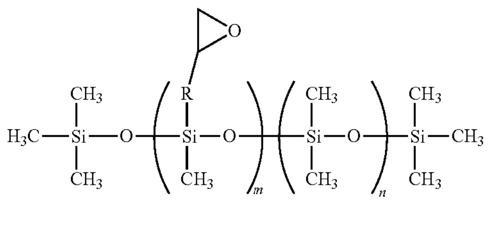

The weight average molecular weight thereof was 31,800. m and n are each the number of repeating units. R is a $C_{1-10}$ alkylene group.

Synthesis Example 5

To 35 g of the component (A), 15 g of KF-1001 (trade name, available from Shin-Etsu Chemical Co., Ltd.) as a component (B) was added to prepare an adhesive (Sample 5).

The structure of KF-1001 is represented by Formula (B-4).

Formula (B-4)

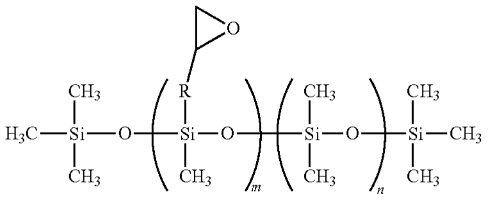

The weight average molecular weight thereof was 55,600. m and n are each the number of repeating units. R is a $C_{1-10}$ alkylene group.

Synthesis Example 6

To 99.99 g of the component (A), 0.01 g of KF-1005 (trade name, available from Shin-Etsu Chemical Co., Ltd.) as a component (B) was added to prepare an adhesive (Sample 6).

The structure of KF-1005 is represented by Formula (B-5).

Formula (B-5)

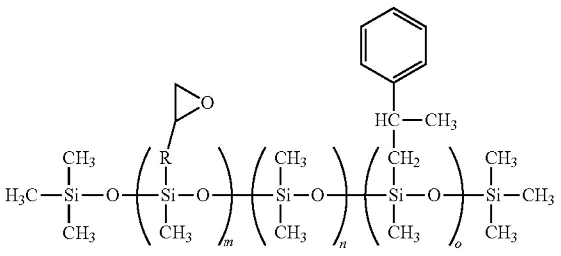

The weight average molecular weight thereof was 11,500. m, n, and o are each the number of repeating units. R is a $C_{1-10}$ alkylene group.

Synthesis Example 7

To 99.995 g of the component (A), 0.005 g of XF-22-343 (trade name, available from Shin-Etsu Chemical Co., Ltd.) as a component (B) was added to prepare an adhesive (Sample 7).

The structure of XF-22-343 is represented by Formula (B-6).

Formula (B-6)

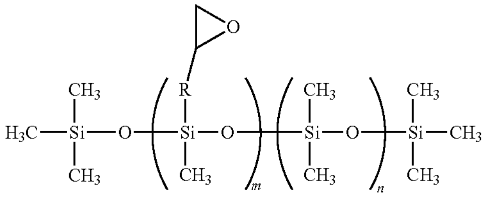

The weight average molecular weight thereof was 2,400. m and n are each the number of repeating units. R is a $C_{1-10}$ alkylene group.

Synthesis Example 8

To 35 g of the component (A), 15 g of SF8411 (trade name, available from Dow Corning Corporation) as a component (B) was added to prepare an adhesive (Sample 8).

The structure of SF8411 was as follows. The viscosity was 8,000 $mm^2/s$, the specific gravity was 0.98, the functional group equivalent weight was 3,300, the weight average molecular weight was 54,800, and the functional group structure was glycidyl type.

Synthesis Example 9

To 35 g of the component (A), 15 g of BY16-839 (trade name, available from Dow Corning Corporation) as a component (B) was added to prepare an adhesive (Sample 9).

The structure of BY16-839 is represented by Formula (B-7).

Formula (B-7)

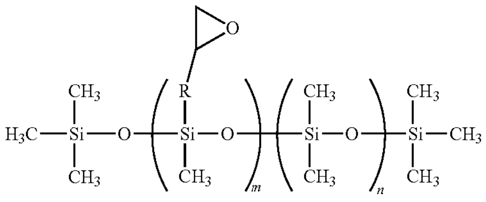

The weight average molecular weight thereof was 51,700. m and n are each the number of repeating units. R is a $C_{1-10}$ alkylene group.

Synthesis Example 10

To 15 g of the component (A), 35 g of ECMS-327 (trade name, available from Gelest, Inc.) as a component (B) was added to prepare an adhesive (Sample 10).

The structure of ECMS-327 is represented by Formula (B-8).

Formula (B-8)

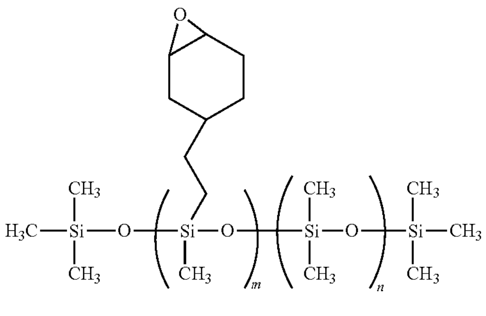

The weight average molecular weight thereof was 28,800. m and n are each the number of repeating units.

Synthesis Example 11

To 35 g of the component (A), 15 g of AK10000 (trade name, available from Wacker Chemie AG) as a component (B) was added to prepare an adhesive (Sample 11).

The structure of AK10000 is represented by Formula (C-1).

Formula (C-1)

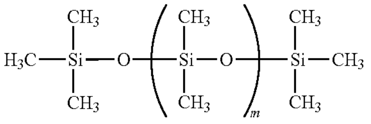

The weight average molecular weight thereof was 63,300. m is the number of repeating units.

Synthesis Example 12

To 99.999 g of the component (A), 0.001 g of XF-22-343 (trade name, available from Shin-Etsu Chemical Co., Ltd.) as a component (B) was added to prepare an adhesive (Sample 12).

The structure of XF-22-343 is represented by Formula (B-6).

Synthesis Example 13

To 10 g of the component (A), 40 g of ECMS-327 (trade name, available from Gelest, Inc.) as a component (B) was added to prepare an adhesive (Sample 13).

The structure of ECMS-327 is represented by Formula (B-2).

Synthesis Example 14

50.56 g of base polymer including a vinyl group-containing MQ resin having a Mw of 6,900 (available from Wacker Chemie AG) as a polyorganosiloxane (a1), 4.38 g of a vinyl group-containing linear polydimethylsiloxane having a viscosity of 1,000 mPa·s (available from Wacker Chemie AG) as a polyorganosiloxane (a2), 4.05 g of vinyl group-containing linear polydimethylsiloxane having a viscosity of 200 mPa·s (available from Wacker Chemie AG) as another polyorganosiloxane (a2), 4.05 g of SiH group-containing linear polydimethylsiloxane having a viscosity of 70 mPa·s (available from Wacker Chemie AG) as yet another polyorganosiloxane (a2), 4.05 g of SiH group-containing linear polydimethylsiloxane having a viscosity of 100 mPa·s (available from Wacker Chemie AG) as yet another polyorganosiloxane (a2), 0.169 g of 1-ethynylcyclohexanol (available from Wacker Chemie AG) as an inhibitor (A3), 0.169 g of 1,1-diphenyl-1,2-propyn-1-ol (available from TCL) as another inhibitor (A3), 6.74 g of 5-nonanone (available from TCL) as yet another inhibitor (A3), and 2.02 g of XF-22-343 (trade name, available from Shin-Etsu Chemical Co., Ltd., Formula (B-6)) as a component (B) were stirred with a stirrer (Awatori Rentaro, manufactured by THINKY CORPORATION).

Separately, 1.0 g of platinum catalyst (available from Wacker Chemie AG) as a platinum group metal-based catalyst (A2) and 5.0 g of vinyl group-containing linear polydimethylsiloxane having a viscosity of 1,000 mPa·s (available from Wacker Chemie AG) as a polyorganosiloxane (a2) were stirred for 5 minutes with a stirrer (Awatori Rentaro manufactured by THINKY CORPORATION) to obtain a mixture. 0.405 g of the mixture was added to the aforementioned mixture, and the mixture was stirred for 5 minutes, to obtain a component (A) in an adhesive (Sample 14).

Measurement of Epoxy Value

The sample in an amount of 0.5 mg was stirred in 50 g of a measurement solution (diisobutyl ketone:acetic acid:tetraethylammonium bromide=1,000:1,000:140) for 30 minutes, and 0.1 mol/L perchloric acid-acetic acid solution was added with an automatic titrator (trade name: GT-100, manufactured by Mitsubishi Chemical Corporation). Thus, the epoxy value of the epoxy-modified polyorganosiloxane was measured.

TABLE 1

| Epoxy compound | Epoxy value |
|---|---|
| Trade name ECMS-227 | 0.32 |
| Trade name ECMS-327 | 0.37 |
| Trade name KF-101 | 3.18 |
| Trade name KF-1001 | 0.28 |
| Trade name KF-1005 | 4.21 |
| Trade name XF-22-343 | 1.97 |
| Trade name SF8411 | 0.22 |
| Trade name BY16-834 | 0.39 |
| Trade name AK10000 | — |

Evaluation of Heat Resistance and Separation Property

In order to form a temporary adhesion layer on a 300-mm silicon wafer (thickness: 770 μm) that was a wafer on a device side, a film having a thickness of about 50 μm was formed from the adhesive on a circuit side of the wafer by spin coating. This wafer having the adhesion layer was attached to a 300-mm glass wafer (thickness: 700 μm) that was a wafer (support) on a carrier side with XBS (attachment apparatus manufactured by SUSS MicroTec AG) so that a resin (the adhesion layer formed from the adhesive that was each of Samples 1 to 14 described above) was disposed between the wafer and the glass wafer. Thus, a layered body was produced. The layered body was then heated at 200° C. for 10 minutes on a hot plate with the wafer on a device side disposed downwardly.

In evaluation of heat resistance, the layered body was heated under vacuum at 220° C. for 10 minutes with a vacuum heating apparatus (manufactured by Ayumi Industries Company Limited), and the presence or absence of separation was then observed. The layered body in which separation was not observed was evaluated to be good (○), and the layered body in which separation was observed was evaluated to be poor (x).

In order to confirm separation property, whether separation was possible or not was determined with a separation apparatus (manual debonder manufactured by SUSS MicroTec AG), and in a case where separation was possible, the presence or absence of destruction of the resin (adhesive) was determined. For separation property, the layered body in which separation was possible was considered to be good (○), and the layered body in which separation was impossible was considered to be poor (x). In evaluation of destruction of the resin, the resin in which destruction was not observed after debonding was considered to be good (○), and the resin in which destruction was observed after debonding was considered to be poor (x).

TABLE 2

| Example | Sample | Heat resistance | Separation property | Destruction of resin |
|---|---|---|---|---|
| Example 1 | Sample 2 | ○ | ○ | ○ |
| Example 2 | Sample 3 | ○ | ○ | ○ |
| Example 3 | Sample 4 | ○ | ○ | ○ |

TABLE 2-continued

| Example | Sample | Heat resistance | Separation property | Destruction of resin |
|---|---|---|---|---|
| Example 4 | Sample 5 | ○ | ○ | ○ |
| Example 5 | Sample 6 | ○ | ○ | ○ |
| Example 6 | Sample 7 | ○ | ○ | ○ |
| Example 7 | Sample 8 | ○ | ○ | ○ |
| Example 8 | Sample 9 | ○ | ○ | ○ |
| Example 9 | Sample 10 | ○ | ○ | ○ |
| Example 10 | Sample 14 | ○ | ○ | ○ |
| Comparative Example 1 | Sample 1 | ○ | X | — |
| Comparative Example 2 | Sample 11 | ○ | X | — |
| Comparative Example 3 | Sample 12 | ○ | X | — |
| Comparative Example 4 | Sample 13 | ○ | ○ | X |

Thinning Test

In order to form an adhesion layer on a 300-mm trimmed silicon wafer (thickness: 770 μm) that was a wafer on a device side, a film having a thickness of about 50 μm was formed from Sample 14 on a circuit side of the wafer by spin coating. This wafer having the adhesion layer was attached to a 300-mm silicon wafer (thickness: 770 μm) that was a wafer (support) on a carrier side with XBS (attachment apparatus manufactured by SUSS MicroTec AG) so that the adhesion layer formed from Sample 14 (the adhesive) was disposed between the wafers. Thus, a layered body was produced. The layered body was then heated at 200° C. for 10 minutes on a hot plate with the wafer on a device side disposed downwardly. The wafer on a device side was thinned to 50 μm with HRG300 (back grinder manufactured by TOKYO SEIMITSU CO., LTD.). After the thinning, the edge of the wafer on a device side was observed with an optical microscope. A case where chipping was not produced was represented to be good by "○" and a case where chipping was produced was represented by "x".

TABLE 3

| Example | Sample | Chipping |
|---|---|---|
| Example 11 | Sample 14 | ○ |

In the layered body formed using Sample 14, chipping was not observed after the thinning. A good result was obtained.

When an epoxy-modified polyorganosiloxane is contained, a rear surface of a wafer can be processed for temporary adhesion. However, when an epoxy-modified polyorganosiloxane as an additive is not contained or the amount of the epoxy-modified polyorganosiloxane is small, separation is not observed. On the other hand, when a large amount of the epoxy-modified polyorganosiloxane is added, destruction of a resin (adhesion layer) is observed. Therefore, the addition amount that is represented by [(B)/(A)+(B)]×100 wherein (A) is the amount of the component (A) to be cured by a hydrosilylation reaction and (B) is the amount of the component (B) containing an epoxy-modified polyorganosiloxane is 0.005 to 70% by mass, and preferably 0.01 to 25% by mass.

When the addition amount of an epoxy silicone is 0.005% or more, separation property that can achieve separation can be obtained. When the addition amount is 70% or less, strength that can last during separation can be obtained.

INDUSTRIAL APPLICABILITY

A layered body in the present invention has a temporary adhesion layer as an additive between a support (supporting substrate) and a wafer. An adhesive forming the temporary adhesion layer contains an adhesive containing a polyorganosiloxane component to be cured by a hydrosilylation reaction and an epoxy-modified polyorganosiloxane component as an additive. This eliminates the need for forming a separation layer, and makes it possible to achieve easy separation after polishing a rear surface of the wafer.

The invention claimed is:

1. A method for forming a layered body comprising:

a first step of applying an adhesive to a surface of a first body to form an adhesion layer, a second step of attaching a surface of a second body to the adhesion layer, and a third step of heating the adhesion layer from a side of the first body to cure the adhesion layer, wherein the adhesive comprises a mixture of a component (A) to be cured by a hydrosilylation reaction, and a component (B) containing an epoxy-modified polyorganosiloxane at a ratio in % by mass of the component (A) to the component (B) of 99.995:0.005 to 30:70, wherein the component (A) contains a polysiloxane (A1) and a platinum group metal-based catalyst (A2), wherein the polysiloxane (A1) contains:

a polyorganosiloxane (a1) selected from the group consisting of a siloxane unit (Q' unit) of $SiO_2$, a siloxane unit (M' unit) of $R^{1'}R^{2'}R^{3'}SiO_{1/2}$, a siloxane unit (D' unit) of $R^{4'}R^{5'}SiO_{2/2}$, a siloxane unit (T' unit) of $R^{6'}SiO_{3/2}$, and a combination thereof, and $R^{1'}$ to $R^{6'}$ are each independently a monovalent chemical group that is a $C_{1-10}$ alkyl group or a $C_{2-10}$ alkenyl group; and a polyorganosiloxane (a2) selected from the group consisting of a siloxane unit (Q" unit) of $SiO_2$, a siloxane unit (M" unit) of $R^{1''}R^{2''}R^{3''}SiO_{1/2}$, a siloxane unit (D" unit) of $R^{4''}R^{5''}SiO_{2/2}$, a siloxane unit (T" unit) of $R^{6''}SiO_{3/2}$, and a combination thereof, and $R^{1''}$ to $R^{6''}$ are each independently a $C_{1-10}$ alkyl group or a hydrogen atom, and wherein the epoxy-modified polyorganosiloxane of component (B) contains a siloxane unit (D''' unit) of $R^{1'''}R^{2'''}SiO_{2/2}$, wherein $R^{1'''}$ is a $C_{1-10}$ alkyl group, and $R^{2'''}$ is a $C_{1-10}$ alkyl group or an epoxy group, provided that $R^{1'''}$ and $R^{2'''}$ are each bonded to a silicon atom through a Si—C bond, and the epoxy-modified polyorganosiloxane of component (B) may optionally further contain one or more units selected from the group consisting of a siloxane unit (Q unit) of $SiO_2$, a siloxane unit (M unit) of $R^1R^2R^3SiO_{1/2}$, and a siloxane unit (T unit) of $R^6SiO_{3/2}$, wherein $R^1$, $R^2$, $R^3$, and $R^6$ are each independently a monovalent chemical group that is a $C_{1-10}$ alkyl group, a $C_{2-10}$ alkenyl group, or a hydrogen atom.

2. The method according to claim 1, wherein component (B) is selected from the group consisting of (B-1), (B-3), and (B-5):

(B-1)

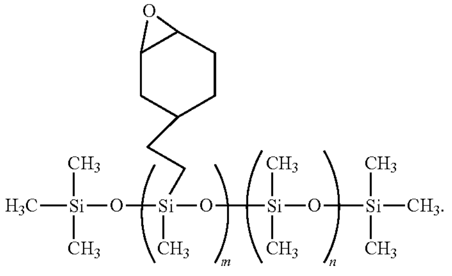

(B-3)

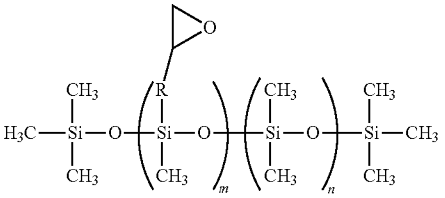

(B-5)

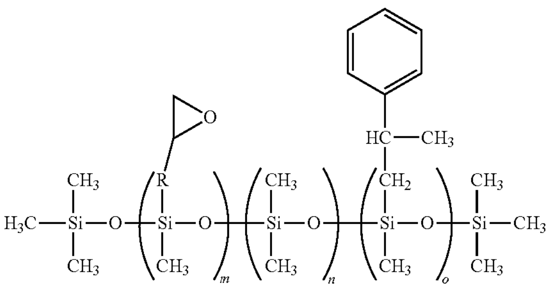

m, n, and o represent respective numbers of repeating units, and R is a $C_{1-10}$ alkylene group.

3. The method according to claim 2, wherein the epoxy-modified polyorganosiloxane of component (B) is (B-1)

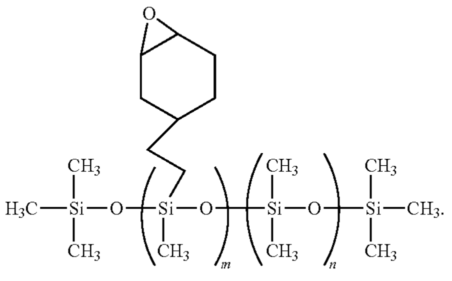

4. The method according to claim 2, wherein the epoxy-modified polyorganosiloxane of component (B) is (B-3)

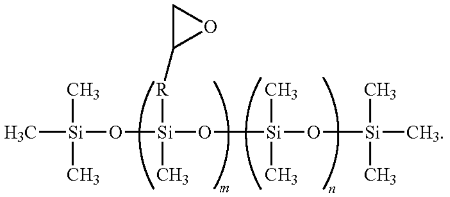

5. The method according to claim 2, wherein the epoxy-modified polyorganosiloxane of component (B) is (B-5)

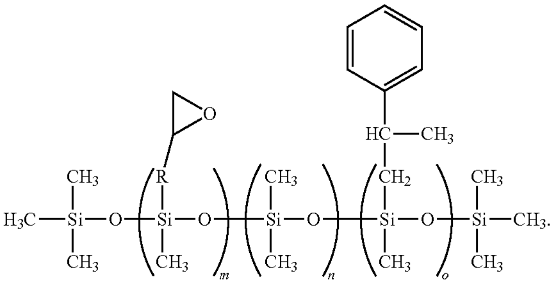

6. The method according to claim 1, wherein $R^{2'''}$ is an epoxy group.

7. The method according to claim 6, wherein $R^{2'''}$ is a 3-glycidoxypropyl group.

8. The method according to claim 1, wherein the first body is a support, the second body is a wafer, and in the second step, a circuit side of the wafer is a face facing the surface of the first body.

9. The method according to claim 1, wherein the first body is a wafer, the second body is a support, and in the second step, a circuit side of the wafer is a face facing the surface of the second body.

10. The method according to claim 1, wherein the component (B) is an epoxy-modified polyorganosiloxane having an epoxy value of 0.1 to 5.

11. A separation method comprising:

a first step of applying an adhesive to a surface of a first body to form an adhesion layer, a second step of attaching a surface of a second body to the adhesion layer, a third step of heating the adhesion layer from a side of the first body to cure the adhesion layer, forming a layered body, a fourth step of processing the layered body, and a fifth step of separating the adhesion layer from the first or second body, wherein the adhesive comprises a mixture of a component (A) to be cured by a hydrosilylation reaction, and a component (B) containing an epoxy-modified polyorganosiloxane at a ratio in % by mass of the component (A) to the component (B) of 99.995:0.005 to 30:70, wherein the component (A) contains a polysiloxane (A1) and a platinum group metal-based catalyst (A2), wherein the polysiloxane (A1) contains:

a polyorganosiloxane (a1) selected from the group consisting of a siloxane unit (Q' unit) of $SiO_2$, a siloxane unit (M' unit) of $R^{1'}R^{2'}R^{3'}SiO_{1/2}$, a siloxane unit (D' unit) of $R^{4'}R^{5'}SiO_{2/2}$, a siloxane unit (T' unit) of $R^{6'}SiO_{3/2}$, and a combination thereof, and $R^{1'}$ to $R^{6'}$ are each independently a monovalent chemical group that is a $C_{1-10}$ alkyl group or a $C_{2-10}$ alkenyl group; and a polyorganosiloxane (a2) selected from the group consisting of a siloxane unit (Q" unit) of $SiO_2$, a siloxane unit (M" unit) of $R^{1''}R^{2''}R^{3''}SiO_{1/2}$, a siloxane unit (D" unit) of $R^{4''}R^{5''}SiO_{2/2}$, a siloxane unit (T" unit) of $R^{6''}SiO_{3/2}$, and a combination thereof, and $R^{1''}$ to $R^{6''}$ are each independently a $C_{1-10}$ alkyl group or a hydrogen atom, and wherein the epoxy-modified polyorganosiloxane of component (B) contains a siloxane unit (D''' unit) of $R^{1'''}R^{2'''}SiO_{2/2}$, wherein $R^{1'''}$ is a $C_{1-10}$ alkyl group, and $R^{2'''}$ is a $C_{1-10}$ alkyl group or an epoxy group, provided that $R^{1'''}$ and $R^{2'''}$ are each bonded to a silicon atom through a Si—C bond, and the epoxy-modified polyorganosiloxane of component (B) may optionally further contain one or more units selected from the group consisting of a siloxane unit (Q unit) of $SiO_2$, a siloxane unit (M unit) of $R^1R^2R^3SiO_{1/2}$, and a siloxane unit (T unit) of $R^6SiO_{3/2}$, wherein $R^1$, $R^2$, $R^3$, and $R^6$ are each independently a monovalent chemical group that is a $C_{1-10}$ alkyl group, a $C_{2-10}$ alkenyl group, or a hydrogen atom.

12. The separation method according to claim 11, wherein component (B) is selected from the group consisting of (B-1), (B-3), and (B-5):

(B-1)

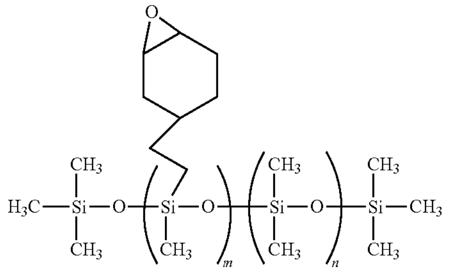

(B-3)

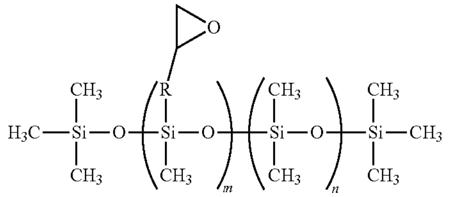

(B-5)

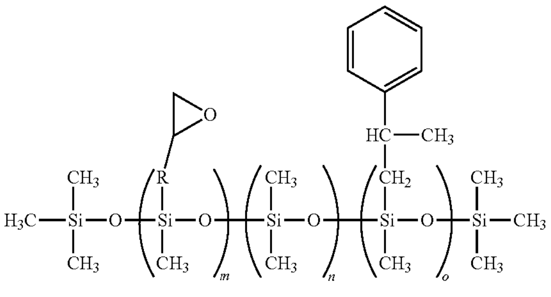

m, n, and o represent respective numbers of repeating units, and R is a $C_{1-10}$ alkylene group.

13. The separation method according to claim 12, wherein the epoxy-modified polyorganosiloxane of component (B) is (B-1)

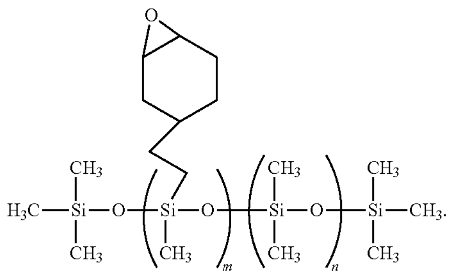

14. The separation method according to claim 12, wherein the epoxy-modified polyorganosiloxane of component (B) is (B-3)

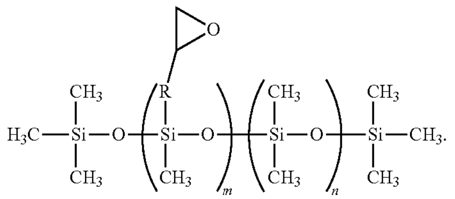

15. The separation method according to claim 12, wherein the epoxy-modified polyorganosiloxane of component (B) is (B-5)

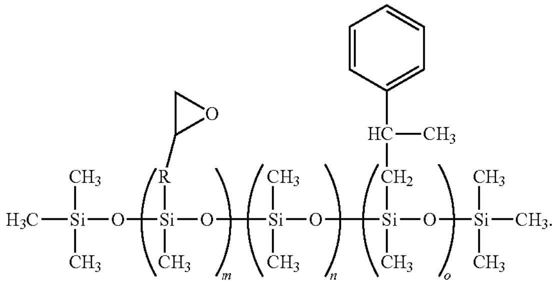

16. The separation method according to claim 11, wherein $R^{2'''}$ is an epoxy group.

17. The separation method according to claim 16, wherein $R^{2'''}$ is a 3-glycidoxypropyl group.

18. The separation method according to claim 11, wherein the first body is a support, the second body is a wafer, and in the second step, a circuit side of the wafer is a face facing the surface of the first body.

19. The separation method according to claim 11, wherein the first body is a wafer, the second body is a support, and in the second step, a circuit side of the wafer is a face facing the surface of the second body.

20. The separation method according to claim 11, wherein the processing is polishing the rear surface of the wafer.

21. The separation method according to claim 11, wherein the component (B) is an epoxy-modified polyorganosiloxane having an epoxy value of 0.1 to 5.

* * * * *